(12) United States Patent
Tsao et al.

(10) Patent No.: US 12,205,859 B2
(45) Date of Patent: Jan. 21, 2025

(54) PACKAGE AND PRINTED CIRCUIT BOARD ATTACHMENT

(71) Applicant: Taiwan Semiconductor Manufacturing Co., Ltd., Hsinchu (TW)

(72) Inventors: Pei-Haw Tsao, Tai-chung (TW); Tsung-Hsing Lu, Jhubei (TW); Li-Huan Chu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/186,310

(22) Filed: Mar. 20, 2023

(65) Prior Publication Data

US 2023/0230891 A1 Jul. 20, 2023

Related U.S. Application Data

(60) Continuation of application No. 17/120,758, filed on Dec. 14, 2020, now Pat. No. 11,610,827, which is a continuation of application No. 16/685,337, filed on Nov. 15, 2019, now Pat. No. 10,867,881, which is a division of application No. 16/036,544, filed on Jul. 16, 2018, now Pat. No. 10,510,633.

(51) Int. Cl.
| | |
|---|---|
| H01L 23/31 | (2006.01) |
| H01L 23/00 | (2006.01) |
| H01L 23/14 | (2006.01) |
| H01L 23/498 | (2006.01) |
| H05K 1/11 | (2006.01) |

(52) U.S. Cl.
CPC ........ *H01L 23/3128* (2013.01); *H01L 23/142* (2013.01); *H01L 23/3114* (2013.01); *H01L 23/49816* (2013.01); *H01L 23/49827* (2013.01); *H01L 24/10* (2013.01); *H05K 1/111* (2013.01)

(58) Field of Classification Search
CPC .......... H01L 23/3218; H01L 23/49827; H01L 23/49816; H01L 24/10
See application file for complete search history.

(56) References Cited

U.S. PATENT DOCUMENTS

| | | | |
|---|---|---|---|
| 6,239,383 | B1 | 5/2001 | Lin |
| 10,867,881 | B2 | 12/2020 | Tsao et al. |
| 2006/0267217 | A1 | 11/2006 | Wong et al. |
| 2007/0193772 | A1 | 8/2007 | Pai |
| 2014/0376202 | A1 | 12/2014 | Shibutani |
| 2015/0340308 | A1 | 11/2015 | Law et al. |

FOREIGN PATENT DOCUMENTS

| | | |
|---|---|---|
| CN | 2893920 Y | 4/2007 |
| CN | 1992239 A | 7/2007 |
| CN | 102332434 A | 1/2012 |
| CN | 104465583 A | 3/2015 |
| CN | 105097725 A | 11/2015 |
| TW | 434767 B | 5/2001 |
| TW | 200625477 A | 7/2006 |
| TW | 201203481 A | 1/2012 |

*Primary Examiner* — Anthony Ho
(74) *Attorney, Agent, or Firm* — Slater Matsil, LLP

(57) ABSTRACT

Generally, the present disclosure provides example embodiments relating to a package that may be attached to a printed circuit board (PCB). In an embodiment, a structure includes a package. The package includes one or more dies and metal pads on an exterior surface of the package. At least some of the metal pads are first solder ball pads. The structure further includes pins, and each of the pins is attached to a respective one of the metal pads.

20 Claims, 7 Drawing Sheets

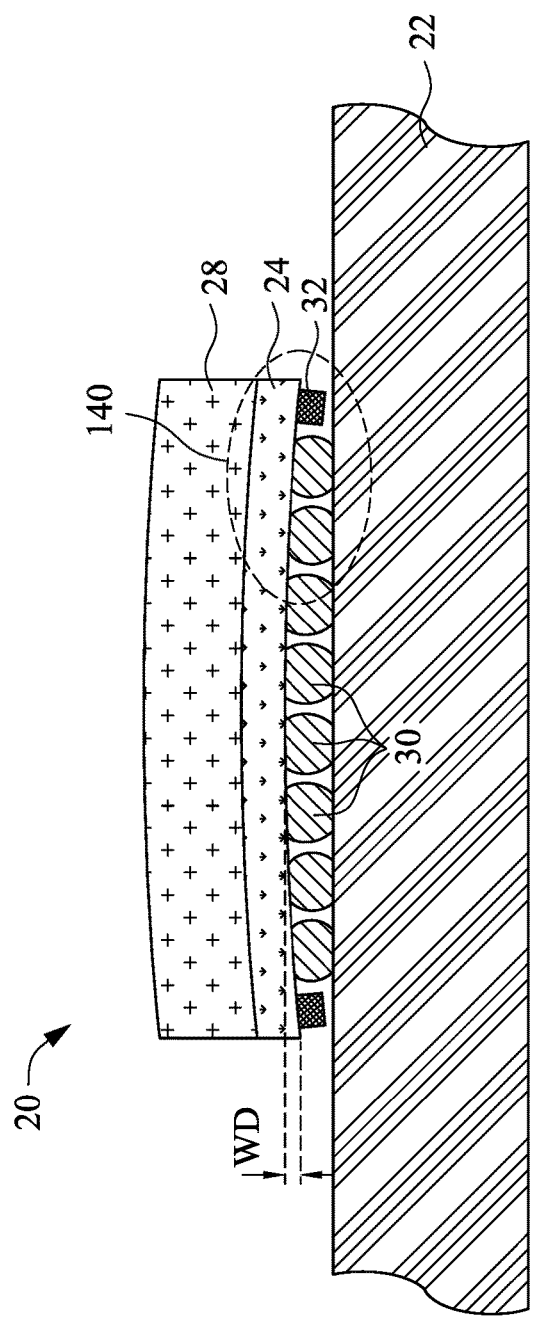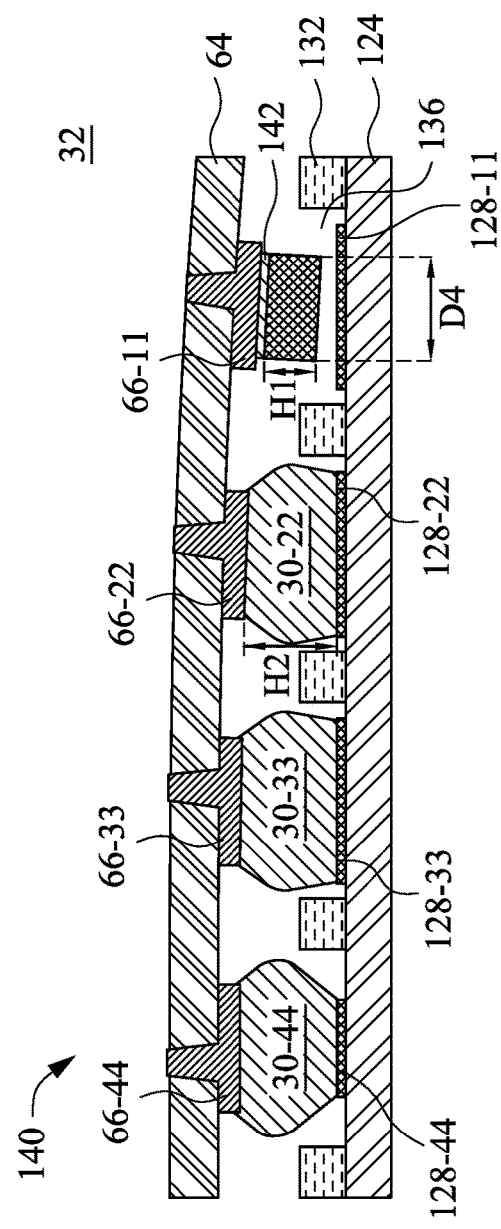

PACKAGE AND PRINTED CIRCUIT BOARD ATTACHMENT

PRIORITY CLAIM AND CROSS-REFERENCE

This application is a continuation of U.S. application Ser. No. 17/120,758, filed on Dec. 14, 2020, entitled "Package and Printed Circuit Board Attachment," now U.S. Pat. No. 11,610,827 issued Mar. 21, 2023, which is a continuation of U.S. application Ser. No. 16/685,337, filed on Nov. 15, 2019, now U.S. Pat. No. 10,867,881 issued Dec. 15, 2020, entitled "Package and Printed Circuit Board Attachment," which is a divisional of U.S. application Ser. No. 16/036,544, filed on Jul. 16, 2018, now U.S. Pat. No. 10,510,633 issued Dec. 17, 2019, entitled "Package and Printed Circuit Board Attachment," each application is hereby incorporated herein by reference.

BACKGROUND

In the electronics industry, generally, integrated circuits are formed on semiconductor dies. The features of the integrated circuits on the semiconductor dies are becoming progressively smaller with advances in semiconductor processing. Semiconductor dies (with integrated circuits) are commonly packaged in packages that contain an interconnect. The interconnect of the package can be formed as an integral part of the package or can be formed independently of other components of the package (such as a package substrate). The interconnect in the package generally provides an interface between the integrated circuit of the semiconductor die and another component.

Packages, and possibly other surface mount devices, can then be attached to a printed circuit board (PCB). The PCB can be a substrate to which any number of components is attached to form a system-level device, for example.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6A and 6B are cross-sectional views of the package mechanically attached and electrically coupled to the PCB in accordance with some embodiments.

DETAILED DESCRIPTION

Figure 1:
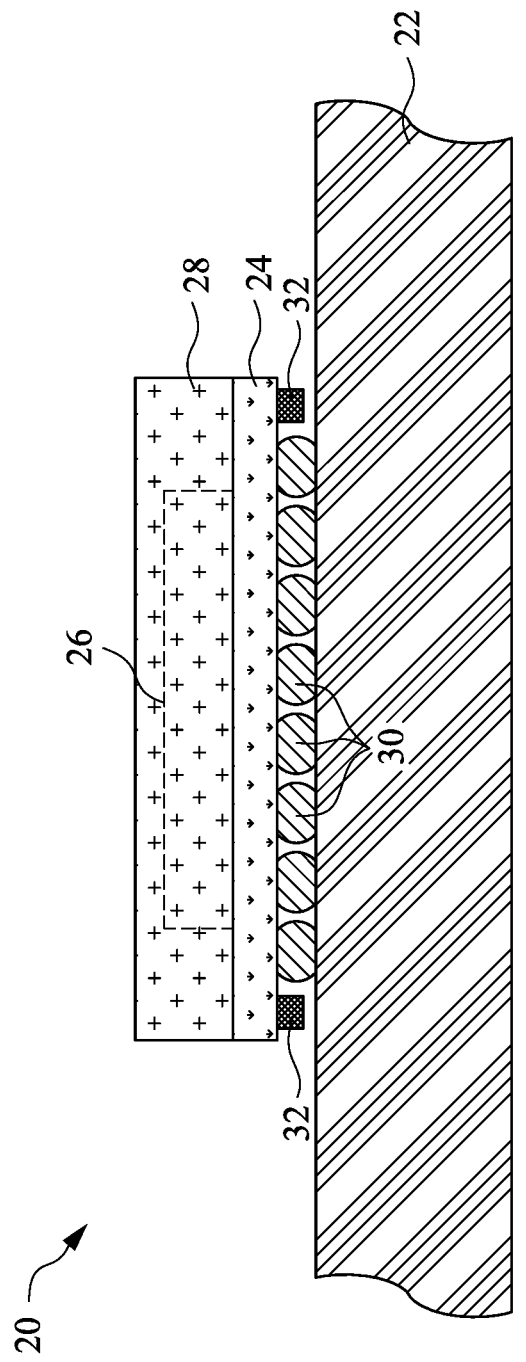
FIG. 1 is a cross-sectional view of a package mechanically attached and electrically coupled to a printed circuit board (PCB) in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, the present disclosure provides example embodiments relating to a package that may be attached to a printed circuit board (PCB). In some examples, the package and PCB are attached by using solder (e.g., solder balls). The PCB and the package each have pads to which the solder is to be attached. Some of the pads, such as pads at corners of the package layout, have respective pins attached thereto. The pins can reduce collapsing of the package on the PCB during a reflow process. The reduced collapsing can reduce a risk of bridging and short circuiting of solder, particularly, at outer portions of the layout of the package. The risk of bridging and short circuiting may result from lateral bulging of the solder due to a reduced height of the solder caused by collapsing during the reflow. Other benefits may be achieved.

Some variations of the example methods and structures are described. A person having ordinary skill in the art will readily understand other modifications that may be made that are contemplated within the scope of other embodiments. Although method embodiments may be described in a particular order, various other method embodiments may be performed in any logical order and may include fewer or more steps than what is described herein. In some figures, some reference numbers of components or features illustrated therein may be omitted to avoid obscuring other components or features; this is for ease of depicting the figures.

FIG. 1 illustrates a cross-sectional view of a package 20 mechanically attached and electrically coupled to a PCB 22 in accordance with some embodiments. The package 20 includes a package substrate 24 and one or more dies 26 on the package substrate 24. The one or more dies 26 are encapsulated on the package substrate 24 by an encapsulant 28, such as a molding compound.

The package 20 can be any package. As illustrated, the package 20 includes a package substrate 24, but such a package substrate can be omitted in other examples, such as when the package has in integrated interconnect like in an integrated fan-out package. The one or more dies 26, which can include any appropriate integrated circuitry, can be mechanically attached and electrically coupled to the package substrate 24 by any suitable technique. For example, the one or more dies 26 can be mechanically attached and electrically coupled to the package substrate 24 using flip chip technology. Controlled collapse chip connects ($C_4$) can be implemented on the one or more dies 26 and can be used to attach the one or more dies 26 to the package substrate 24. In another example, the one or more dies 26 can be mechanically attached to the package substrate 24 by an adhesive and can be electrically coupled to the package substrate 24 by wire bonding. Any other technology can be used to mechanically attach and electrically couple the one or more dies 26 to the package substrate 24. If more than one die 26 is included in the package 20, any combination of technologies, e.g., flip chip, wire bonding, etc., can be implemented to mechanically attach and electrically couple the dies 26 to the package substrate 24.

After the one or more dies 26 are mechanically attached and electrically coupled to the package substrate 24, the one or more dies 26 are encapsulated on the package substrate 24. In some examples, the one or more dies 26 are encapsulated by a molding compound using compression molding, transfer molding, or another molding process.

The package substrate 24 includes a number of metal layers that include vias and lines that route interconnections. The package substrate 24 can redistribute and/or interconnect various signals and/or components through the vias and/or lines of the metal layers. Additional details of example package substrates are described below.

The package 20 is mechanically attached and electrically coupled to the PCB 22 by solder balls 30. The solder balls 30 are or include a lead-free solder, such as tin, silver, copper (Sn—Ag—Cu or SAC) solder, or another solder. Solder can be formed on pads of the package substrate 24, such as by printing, plating, evaporation, or another process. The package 20 can be placed on the PCB 22 such that the solder aligns with respective pads on the PCB 22, and a reflow process can be performed to reflow the solder thereby forming the solder balls 30 that attach the package 20 to the PCB 22. Multiple packages can be mechanically attached and electrically coupled to the PCB 22.

Further, pins 32 are attached to the package 20 at various locations on the package 20, such as at outer areas in the layout of the package 20 like at corners. The pins 32 each include a rigid material, such as a metal-containing material that has a melting point above the melting point of the solder used for the solder balls 30. In some examples, the pins 32 are copper, gold plated copper, or the like. The pins 32 can be attached to pads on the package substrate 24, such as by soldering the pins 32 to respective pads or by metal bonding the pins 32 to respective pads. The pins 32 can provide a mechanical support frame for the package 20 during the reflowing of the solder balls 30 to prevent collapsing of the package 20. Additional details of the pins 32 are described subsequently.

The PCB 22 includes multiple metal layers that each includes lines, which may be interconnected between layers by through-hole connectors. The PCB 22 can redistribute and/or interconnect various signals and/or components through the through-hole connectors and/or lines. The PCB 22 with various packages attached thereto may implement a system or portion thereof. Additional details of example PCBs are described below.

Figure 2:
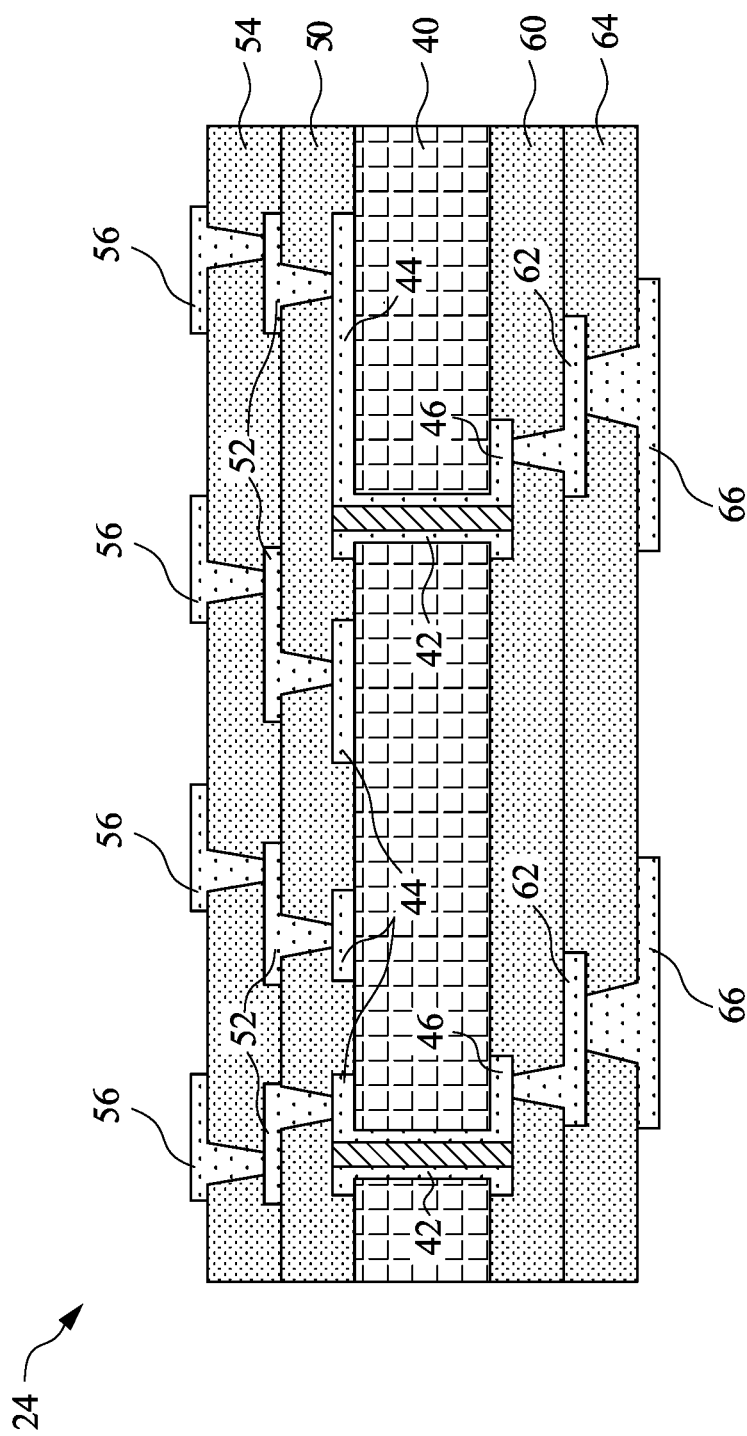
FIG. 2 is a cross-sectional view of a portion of the package substrate in accordance with some embodiments.

FIG. 2 illustrates a cross-sectional view of a portion of the package substrate 24. The package substrate 24 includes a core 40. The core 40 provides mechanical strength and rigidity for the package substrate 24. The core 40, in some embodiments, is or includes a layer of pre-preg (e.g., a fiberglass matrix injected with an epoxy resin, such as FR-4). The layer of pre-preg can have a metal foil (e.g., copper foil) on opposing sides. Through-holes can be formed through the layer of pre-preg and plated with a metal (e.g., copper) to form through-hole connectors 42. The metal foil on the opposing sides can be etched using photolithography and etch processes to form metal lines on the opposing sides. Hence, the core 40 can include through-hole connectors 42 electrically coupled to various metal lines 44, 46 on opposing sides of the core 40.

Various levels of insulating layers and metal layers are then formed on the core 40. For convenience, "front-side" is used herein to designate the side of the core 40 on which the one or more dies 26 are to be attached, and "back-side" is used herein to designate the side of the core 40 opposite from the front-side.

As illustrated, a first front-side insulating layer 50 is formed on the core 40 and metal lines 44. The first front-side insulating layer 50, in some examples, is an Ajinomoto Build-up Film (ABF) or the like, and is laminated or formed by another process on the core 40 and metal lines 44. Via openings are formed through the first front-side insulating layer 50 to underlying metal lines 44 using laser drilling, for example. A metal seed layer is formed on the first front-side insulating layer 50, such as by using physical vapor deposition (PVD), and a photoresist is formed and patterned over the metal seed layer. A plating process (such as electroless or electroplating) is performed to form metal lines 52 and vias (not individually numbered) to connect the metal lines 52 with the underlying metal lines 44. The photoresist is then removed, such as by using a wet stripping process, and the exposed metal seed layer is removed, such as by a wet etching process. The metal seed layer can be or include copper, titanium, another metal, or a combination thereof, and the metal lines 52 and vias can be or include copper, another metal, or a combination thereof. A second front-side insulating layer 54 and die-connection pads 56 with vias are formed on the first front-side insulating layer 50 and metal lines 52. The second front-side insulating layer 54 and die-connection pads 56 with vias can be formed using the same processes as described with respect to the first front-side insulating layer 50 and metal lines 52 with vias. The die-connection pads 56 can be configured and arranged according to how the one or more dies 26 are to be attached to the package substrate 24. For example, the die-connection pads 56 can be configured and arranged to accommodate flip chip connections, wire bonding, or other connections.

A first back-side insulating layer 60 is formed on the core 40 and metal lines 46. Metal lines 62 and vias (not individually numbered) are formed to connect the metal lines 62 with the underlying metal lines 46. The first back-side insulating layer 60 and metal line 62 with vias can be formed using the same processes as described with respect to the first front-side insulating layer 50 and metal lines 52 with vias. A second back-side insulating layer 64 and pads 66 with vias are formed on the first back-side insulating layer 60 and metal lines 62. The second back-side insulating layer 64 and pads 66 with vias can be formed using the same processes as described with respect to the first front-side insulating layer 50 and metal lines 52 with vias. The pads 66 can be configured and arranged according to a ball grid array (BGA) matrix, for example, on which the solder balls 30 can be formed.

The one or more dies 26 can be attached to the package substrate 24 at various times of forming the package substrate 24. For example, the one or more dies 26 can be attached (such as by flip chip connections, wire bonding, etc.) on the front-side of the package substrate 24 after back-side processing (e.g., forming back-side insulating layers 60, 64, metal lines 62, and pads 66) is performed. In other examples, the one or more dies 26 can be attached on the front-side of the package substrate 24 before back-side processing is performed. In such examples, the one or more dies 26 can be attached on the front-side of the package substrate 24 and encapsulated by the encapsulant 28 (such as described above) before back-side processing is performed.

The package substrate 24 is merely an example. Any number of insulating layers and metal layers including metal lines and vias can be formed on the front-side and/or the back-side of the core. In some examples, package substrates can omit a core and any associated components. A package substrate can be formed by any process according to any technology.

Figure 3:
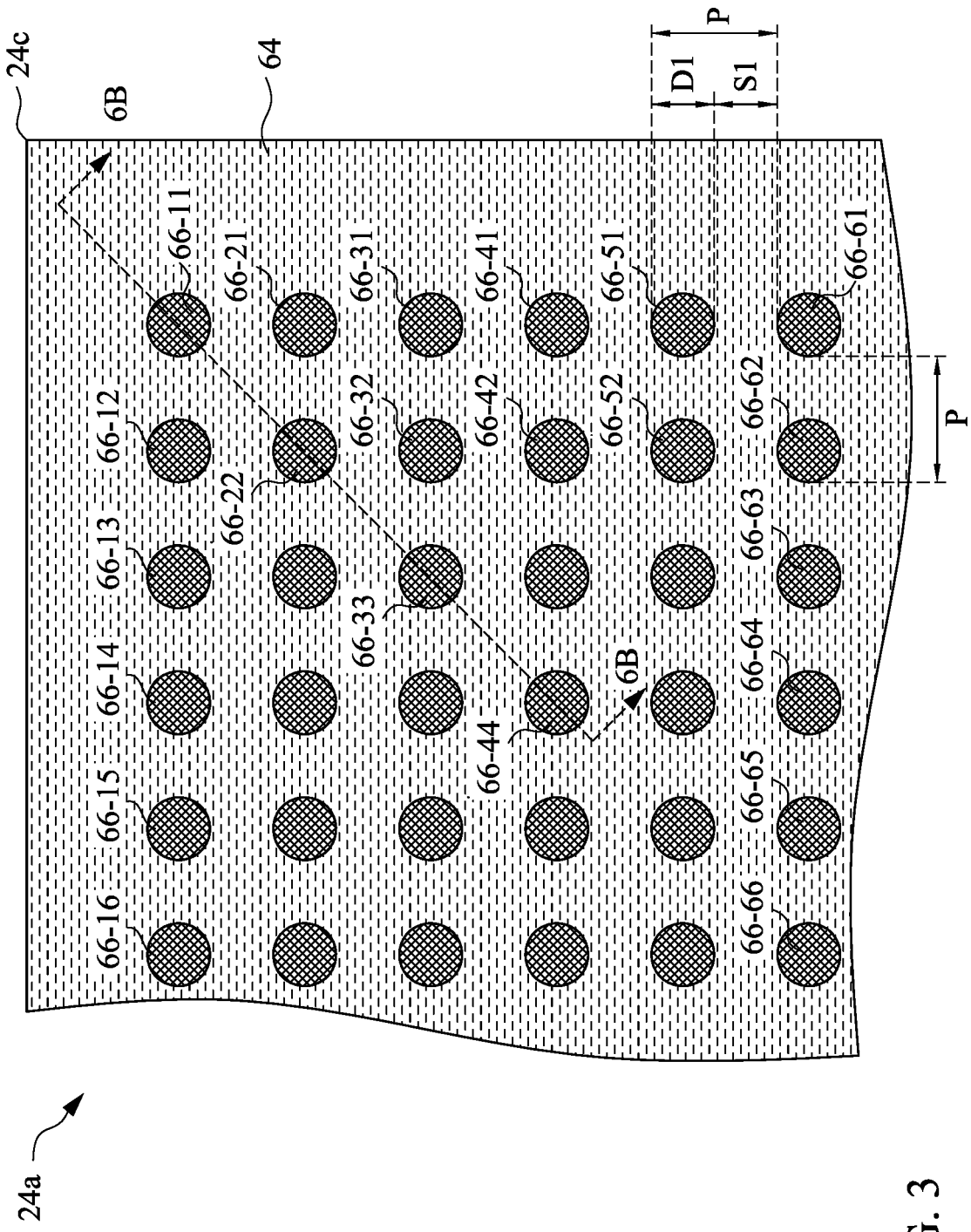
FIG. 3 is a layout view of a corner portion of the package substrate in accordance with some embodiments.

FIG. 3 illustrates a layout view of a corner portion 24a of the package substrate 24 in accordance with some embodiments. In some examples, a layout of the package substrate 24 is rectangular, such as a square or rectangle. In such examples, the corner portion 24a is representative of each of the four corners in the layout of the package substrate 24. In the layout, pads 66 are arranged in a matrix comprising rows (as referenced herein, x number of rows) and columns (as referenced herein, y number of columns). Although not necessarily illustrated, the matrix can include pads 66 throughout the area of the matrix according to the rows and columns, or can omit pads in some locations, such as in a center area of the layout of the package substrate 24. As illustrated, the matrix includes rows of pads 66, where a first row includes pads 66-1$j$, a second row includes pads 66-2$j$, a third row includes pads 66-3$j$, etc. (where j is 1 to y). The matrix includes columns of pads 66, where a first column includes pads 66-$i$$i$, a second column includes pads 66-$i$2, a third column includes pads 66-$i$3, etc. (where i is 1 to x). A pitch P between neighboring pads 66 along a row or along a column can be in a range from about 200 μm to about 1000 μm, such as about 1000 μm. As illustrated in FIG. 3, the pitch P is between pads 66-51 and 66-61 in a column, and is between pads 66-61 and 66-62 in a row. The pads 66 have a first diameter D1, and have a first spacing S1 between neighboring pads 66 along a row or along a column. The first diameter D1 plus the first spacing S1 is equal to the pitch P. The first diameter D1 can be in a range from about 90 μm to about 600 μm, such as about 525 μm, and the first spacing S1 can be in a range from about 100 μm to about 500 μm, such as about 475 μm. Although described as having a diameter and being illustrated as circular, the pads 66 can have any geometry, such as any polygon.

In the examples where the layout of the package substrate 24 is rectangular, the outer rows of the matrix of pads 66 (e.g., pads 66-1$j$ and 66-$xj$) and outer columns of the matrix of pads 66 (e.g., pads 66-$i$1 and 66-$iy$) also form a rectangular shape. Hence, the matrix of pads 66 includes four corner pads 66-11, 66-1$y$, 66-$x$1, and 66-$xy$. Each of the respective four corner pads 66-11, 66-1$y$, 66-$x$1, and 66-$xy$ is the respective pad 66 closest to a corner of the layout of the package substrate 24. For example, as illustrated, the corner pad 66-11 is the pad 66 of the matrix closest to the corner 24c of the layout of the package substrate 24. As will become apparent subsequently, corner pads 66-11, 66-1$y$, 66-$x$1, and 66-$xy$ may be attached to a pin 32 for mechanical support during thermal cycling, and hence, these corner pads 66-11, 66-1$y$, 66-$x$1, and 66-$xy$, in some examples, may not be electrically connected to other electrically conductive features in the package substrate 24. In some examples, corner pads may be electrically connected to other electrically conductive features in the package substrate 24.

In some examples, such as those illustrated in the figures and described herein, a pin 32 is to be attached at each of the four corner pads 66-11, 66-1$y$, 66-$x$1, and 66-$xy$. In other examples, pins 32 can be attached to other pads 66, such as along outer rows and/or columns of the matrix of pads. Any number of pins 32 may be implemented and may be located at any location in the matrix. Further, one or more pin pads, to which a respective pin can be attached, can be formed (similar to the pads 66) exterior to the matrix of pads 66, and the matrix can include pads 66 for attachment to any number of solder balls and pins or can omit any pads for attachment to any pin. For example, a pin pad can be along the diagonal of the pads 66-44, 66-33, 66-22, and 66-11 and closer to the corner 24c than any of the pads 66 in the matrix, particularly, closer to the corner 24c than the pad 66-11.

FIG. 3 further illustrates a cross-section 6B that is illustrated in further detail in FIG. 6B. The cross-section 6B is across pads 66-11, 66-22, 66-33, and 66-44.

Figure 4:
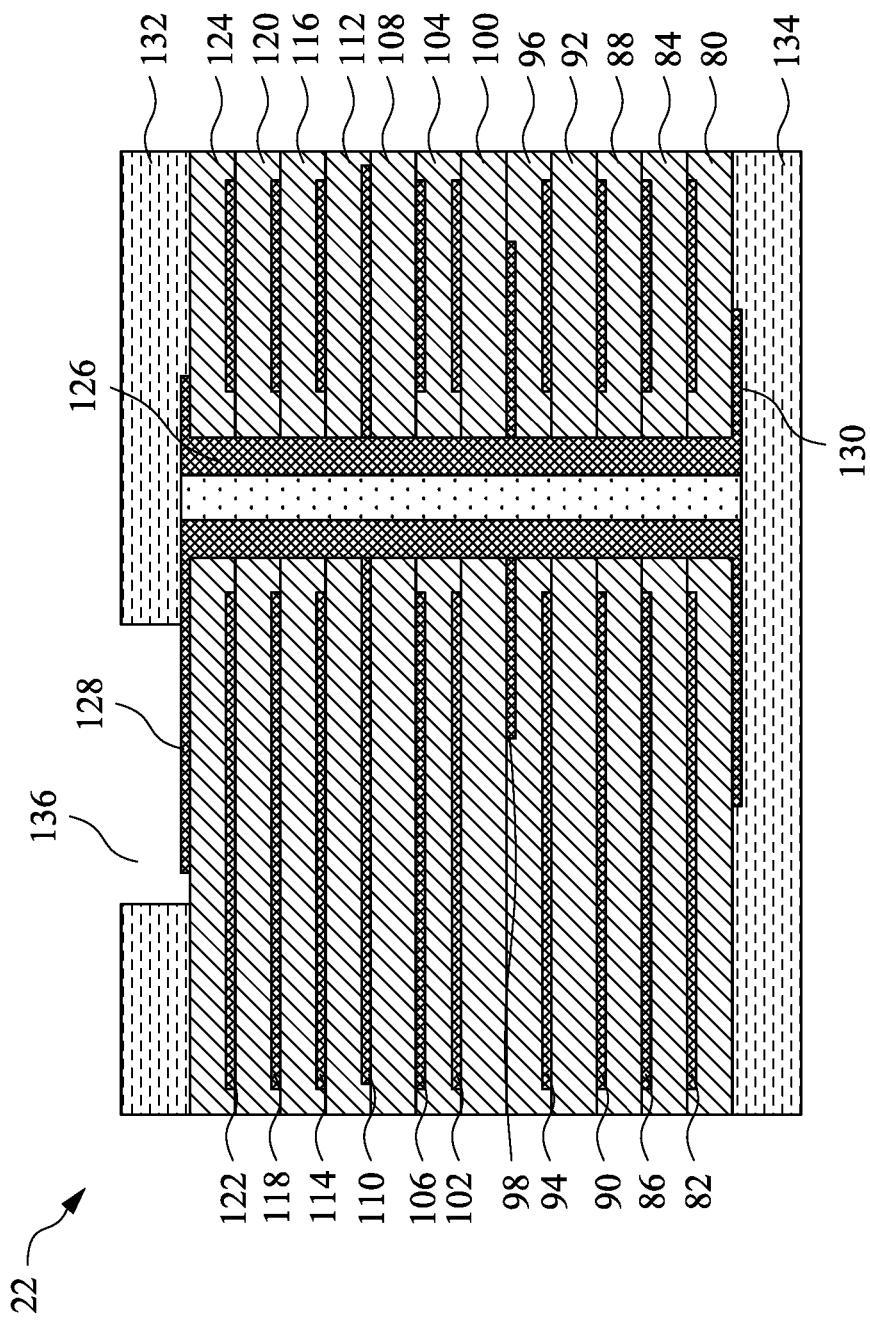
FIG. 4 is a cross-sectional view of a portion of the PCB in accordance with some embodiments.

FIG. 4 illustrates a cross-sectional view of a portion of the PCB 22 in accordance with some embodiments. The PCB 22 includes a number of insulating layers 80, 84, 88, 92, 96, 100, 104, 108, 112, 116, 120, and 124 and a number of metal layers. The various metal layers as illustrated include metal lines 82, 86, 90, 94, 98, 102, 106, 110, 114, 118, and 122. In some examples, the PCB 22 includes ten to thirty different insulating layers with a metal layer disposed between each neighboring pair of insulating layers.

In some examples, each of the insulating layers 80, 84, 88, 92, 96, 100, 104, 108, 112, 116, 120, and 124 of the PCB 22 is or includes a layer of pre-preg (e.g., a fiberglass matrix injected with an epoxy resin, such as FR-4). The layer of pre-preg can initially have a metal foil (e.g., copper foil) on one or both opposing sides. Each metal foil is patterned into the corresponding metal lines 82, 86, 90, 94, 98, 102, 106, 110, 114, 118, and 122 using photolithography and etch processes. After the metal foils are patterned to form corresponding metal lines, the insulating layers are joined together. The insulating layers are aligned and pressed together to bond the insulating layers.

After the insulating layers are joined, through-hole connectors 126 are formed through the insulating layers. Holes can be formed through the joined insulating layers using drilling, for example. After forming the holes, the joined insulating layers may be plated with a metal (e.g., copper and/or tin). The plating forms the through-hole connectors 126 in the holes and can also form a metal layer on the exterior surfaces of the joined insulating layers. The metal layers on the exterior surfaces are patterned. On an exterior surface, pads 128 with metal lines connecting the pads 128 to the through-hole connectors 126 are patterned. On another exterior surface, metal lines 130 or other patterns are patterned. The patterning of the pads 128 with metal lines and/or the metal lines 130 on the exterior surfaces can be implemented by photolithography and etching processes, and/or a photolithography process and the plating that deposits the metal.

Solder masks (or solder resists) 132 and 134 are formed on respective exterior surfaces of the joined insulating layers. The solder masks 132 and 134 can be patterned to expose an underlying metal pattern. For example, as illustrated, the solder mask 132 is patterned, using a photolithography process, to define openings 136 that expose the pads 128.

Figure 5:
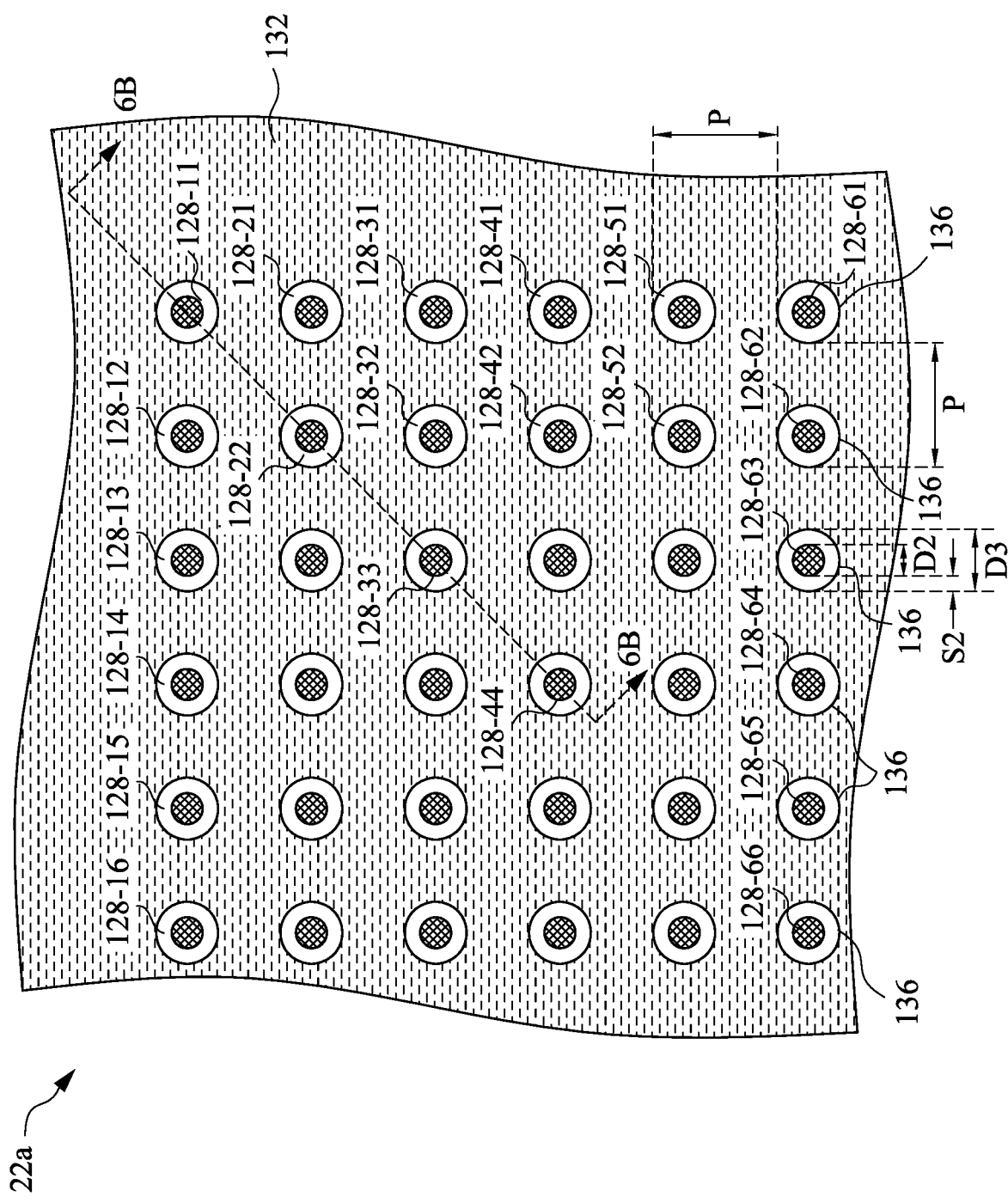
FIG. 5 is a layout view of a portion of the PCB in accordance with some embodiments.

FIG. 5 illustrates a layout view of a portion 22a of the PCB 22 in accordance with some embodiments. In the layout, pads 128 are arranged in a matrix comprising rows (as referenced herein, x number of rows) and columns (as referenced herein, y number of columns). The matrix of pads 128 corresponds to the matrix of pads 66 on the package substrate 24. Although not necessarily illustrated, the matrix can include pads 128 throughout the area of the matrix according to the rows and columns, or can omit pads in some locations, such as in a center area of the layout of the matrix. As illustrated, the matrix includes rows of pads 128, where a first row includes pads 128-1j, a second row includes pads 128-2j, a third row includes pads 128-3j, etc. (where j is 1 to y). The matrix includes columns of pads 128, where a first column includes pads 128-i1, a second column includes pads 128-i2, a third column includes pads 128-i3, etc. (where i is 1 to x). Each pad 128 is exposed through a respective opening 136 through the solder mask 132.

The pitch P is between neighboring pads 128 and/or openings 136 along a row or along a column. The pads 128 have a second diameter D2. Each of the openings 136 has a third diameter D3. The third diameter D3 is greater than each of the second diameter D2. In some examples, the second diameter D2 is in a range from about 100 µm to about 550 µm, such as about 525 µm, and the third diameter D3 is in a range from about 150 µm to about 600 µm, such as about 575 µm. Although described as having a diameter and being illustrated as circular, the pads 128 can have any geometry, such as any polygon.

Gaps are defined between the edges of pads 128 and respective sidewalls of the openings 136. The gaps have a second spacing S2 between the edge of the pad 128 and the sidewall of the opening 136. In some examples, the second spacing S2 is in a range from about 15 µm to about 50 µm, such as about 25 µm. In other examples, the openings 136 can have varying diameters, and/or the spacing of gaps formed in the openings 136 can be equal or vary throughout the matrix. Although described as having a diameter and being illustrated as circular, the openings 136 can have any geometry, such as any polygon.

As illustrated and described the pads 128 are non-solder mask defined pads. The openings 136, as illustrated, are larger than the areas of the pads 128, which form the gaps between the edges of the pads 128 and the sidewalls of the opening 136. In other examples, the pads may be solder mask defined pads. In such examples, the openings 136 define the areas of the pads on which the solder balls are to be formed.

As previously stated, in some examples, a pin 32 is to be attached at each of the four corner pads 66-11, 66-1y, 66-x1, and 66-xy. In the layout of the PCB 22 in FIG. 5, corresponding pads 128 (e.g., pads 128-11, 128-1y, 128-x1, and 128-xy) can be included in the matrix or omitted. Since pins 32 are attached to the respective pads 66 at these locations, no electrical connection and no mechanical attachment is made to the PCB 22 at these locations. The pins 32 may or may not contact the PCB 22, and the pins 32 may or may not be directly, permanently attached to the PCB 22. A pad on the PCB 22 may be formed at each location corresponding to the placements of pins 32, which may be within the matrix and/or exterior to the matrix. Such pad(s) (if implemented) on the PCB 22, in some examples, may not be electrically connected to other electrically conductive features in the PCB 22, while in some examples, such pad(s) may be electrically connected to other electrically conductive features in the PCB 22. In other examples, the solder mask 132 may be formed at locations corresponding to the placements of pins 32. Other modifications and variations may be implemented.

FIG. 5 further illustrates a cross-section 6B that is illustrated in further detail in FIG. 6B. The cross-section 6B is across pads 128-11, 128-22, 128-33, and 128-44.

FIGS. 6A and 6B illustrate cross-sectional views of the package 20 mechanically attached and electrically coupled to the PCB 22 in accordance with some embodiments. FIG. 6B illustrates a corner portion 140 shown in FIG. 6A. FIGS. 6A and 6B illustrate the package 20 and PCB 22 after thermal cycling, such as after a reflow process to reflow the solder balls 30. In some examples, a coefficient of thermal expansion (CTE) of the encapsulant 28 (e.g., molding compound) and/or other components on the package substrate 24 is greater than a CTE of the package substrate 24. Hence, when the package 20 is heated during a reflow process, the encapsulant 28 and/or other components can expand a greater amount than the package substrate 24. The difference in the amount of expansion can cause warpage of the package 20. As illustrated, when the encapsulant 28 and/or other components expand a greater amount than the package substrate 24, a bottom surface of the package substrate 24 (e.g., to which the solder balls 30 are attached) can become concave. Locations in the package 20 farthest from a center of the package 20 can experience a greatest warpage deflection WD. For example, when a layout of the package 20 is rectangular, such as described above, corners of the layout are generally the locations in the package 20 farthest from the center of the package 20, and hence, a greatest warpage deflection WD can be observed at the corners. Even further, the larger the layout of the package 20 is (such as for a 50 mm×50 mm layout), the larger the warpage deflection WD can become.

When the warpage deflection WD occurs during reflowing of the solder balls 30, a volume available to outer solder balls, and more particularly, solder balls 30 proximate the corners, to flow can be decreased. The warpage deflection WD can cause a height between pads 66 on the package substrate 24 and pads 128 on the PCB 22 to decrease. Assuming that the pads 66 on the package substrate 24 have a same attachment area and pitch and that the pads 128 on the PCB 22 have a same attachment area and pitch, solder balls 30 at the corners risk laterally bulging to accommodate the reduced height due to warpage. This bulging can cause bridging and short circuiting between solder balls 30.

According to some embodiments, pins 32 are positioned in various locations, such as along the periphery (e.g., corners), on the package 20 to prevent some amount of collapse of the package 20 during the reflowing. The pins 32 can provide mechanical support to the package 20 during the reflowing to prevent the collapse. For example, when the warpage deflection WD occurs, the greatest warpage deflection WD can be at the corners of the package 20, which can cause more force (e.g., weight of the package 20) to be applied on solder balls 30 proximate the corners. This can cause the height of the solder balls 30 proximate the corners to decrease and collapse. In some examples, pins 32 are located at the corners of the package, and when the solder balls begin to collapse due to warpage, the pins 32 attached to the package 20 can contact the PCB 22 to provide mechanical support to the package 20 during the reflowing. This mechanical support can prevent further collapse of solder balls 30 and can reduce the risk of bulging and short circuiting between solder balls 30.

FIG. 6B illustrates some components illustrated in the layout views of FIGS. 3 and 5. More specifically, FIG. 6B illustrates pads 66-11, 66-22, 66-33, and 66-44 on the package substrate 24 shown in FIG. 3 and pads 128-11, 128-22, 128-33, and 128-44 on the PCB 22 shown in FIG. 5. A pin 32 is attached to the pad 66-11. Corresponding solder balls 30-22, 30-33, and 30-44 are attached to the pads 66-22, 66-33, and 66-44 and the pads 128-22, 128-33, and 128-44.

FIG. 6B further illustrates a first height H1 of the pin 32 at a corner of the matrix and a second height H2 of the solder ball 30-22 proximate the corner of the matrix. As illustrated, during reflowing of the solder balls 30, the second height H2 of the solder ball 30-22 may become reduced due, in part, to the warpage of the package 20. As the second height H2 is reduced, the pin 32 is brought near to the pad 128-11 until the pin 32 contacts the pad 128-11. Once the pin 32 contacts the pad 128-11, the pin 32 provides mechanical support to the package 20 to prevent further reduction in the second height H2. The pin 32 maintains rigidity during the reflow process to provide the mechanical support. For example, if the pin 32 is metal, the metal of the pin 32 has a higher melting point than the temperature used in the reflow process and a melting point of the solder balls 30. By preventing further reduction of the second height H2, further bulging of the solder ball 30-22 may be prevented, which can prevent short circuiting between solder balls 30. With multiple pins 32, the pins 32 may provide a mechanical support frame for supporting the package 20 when the pins 32 contact the PCB 22.

The pin 32 illustrated in FIG. 6B is attached to the pad 66-11 using solder 142. In other examples, the pin 32 can be attached to the pad 66-11 using a metal-to-metal bond or other mechanism. The pin 32 is illustrated as having a fourth diameter D4, which can be in a range from about 0.1 mm to about 0.2 mm. The first height H1 of the pin 32, in some examples, is in a range from about 50% to about 80% of a lateral diameter of any solder ball 30 and/or of an average middle, lateral diameter of the solder balls 30. The first height H1 can vary depending on placement of the pin 32. For example, if a pin 32 is more proximate the center of the layout of the package 20, the larger the first height H1 may be. The first height H1 may also take into consideration the design of the PCB 22. The first height H1, by being less than a diameter of one or more solder balls 30, can permit proper contact of the solder balls 30 to the pads 66 and the pads 128 during the reflowing of the solder balls 30. As illustrated, the placement of the pin 32 corresponds to the pad 128-11 that is exposed by an opening 136 through the solder mask 132. In other examples, the placement of the pin 32 may have a corresponding location on the solder mask 132 on the PCB 22. Hence, in such examples, the first height Hi may be reduced to account for the thickness of the solder mask 132 that the pin 32 may contact during reflowing. The pin 32 is illustrated as being cylindrical, but this is merely an example. The pin 32 can taper, can have a base attached to the pad 66 with an extending portion of any shape, or any other geometry.

Although the pins 32 have been described herein as being attached to the package 20 in various locations, in some examples, the pins 32 are attached to the PCB 22 instead of the package 20. In further examples, some pins 32 are attached to the package 20 while other pins 32 are attached to the PCB. The locations of the pins 32 in the various examples can vary as described previously.

Figure 7:
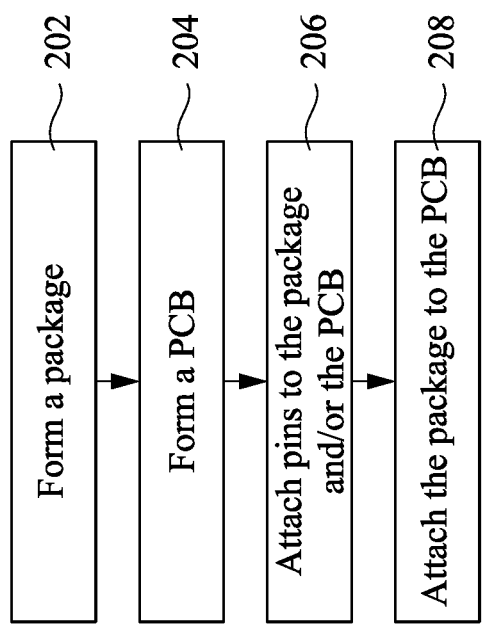
FIG. 7 is a flow chart for forming a package attached to a PCB in accordance with some embodiments.

FIG. 7 is a flow chart for forming a package attached to a PCB in accordance with some embodiments. In operation 202, a package is formed, such as to be described subsequently with reference to FIG. 8. In operation 204, a PCB is formed, such as to be described subsequently with reference to FIG. 9. In operation 206, pins are attached to the package and/or the PCB. For example, pins can be attached by solder, metal-to-metal bonding, or another mechanism to respective pads on the package and/or PCB. In operation 208, the package is attached to the PCB. For example, solder can be formed on pads on the package and/or the PCB. The package can be placed on the PCB and aligned such that the pads on the package align with appropriate pads on the PCB with the solder disposed therebetween. The solder is then reflowed to form a more permanent mechanical and electrical attachment between the pads of the package and the pads of the PCB.

Figure 8:
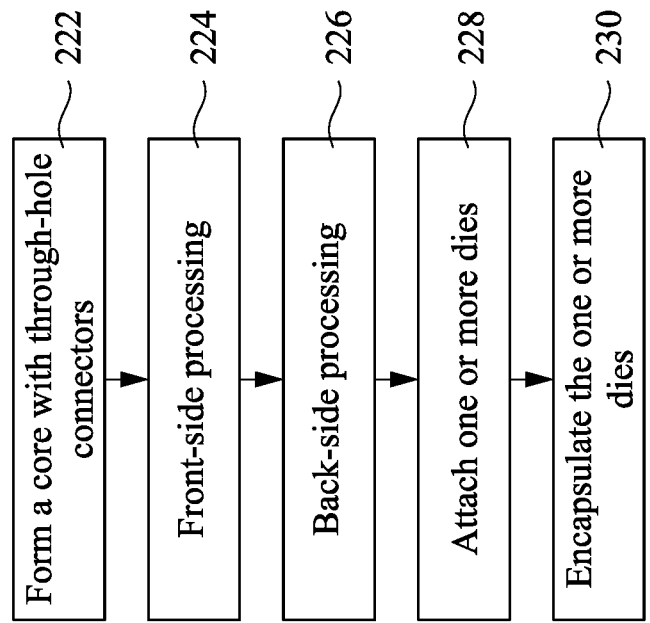
FIG. 8 is a flow chart for forming a package in accordance with some embodiments.

FIG. 8 is a flow chart for forming a package in accordance with some embodiments. In operation 222, a core is formed with through-hole connectors. The core can be formed as described above with respect to FIG. 2. In operation 224, front-side processing is performed to form one or more insulating layers with one or more metal layers on the front-side of the core. Any number of insulating layers and metal layers may be formed on the front-side as described above with respect to FIG. 2. In operation 226, back-side processing is performed to form one or more insulating layers with one or more metal layers on the back-side of the core. Any number of insulating layers and metal layers may be formed on the back-side as described above with respect to FIG. 2. The insulating layers on the front-side and back-side, the metal layers disposed in the insulating layers, and the core form a package substrate. In operation 228, one or more dies are attached to the front-side of the package substrate, such as described above with respect to FIG. 2. In operation 230, the one or more dies are encapsulated on the front-side of the package substrate. For example, an encapsulant, such as a molding compound, may be used to encapsulate the one or more dies, such as by using compression molding, transfer molding, or another molding process.

Figure 9:
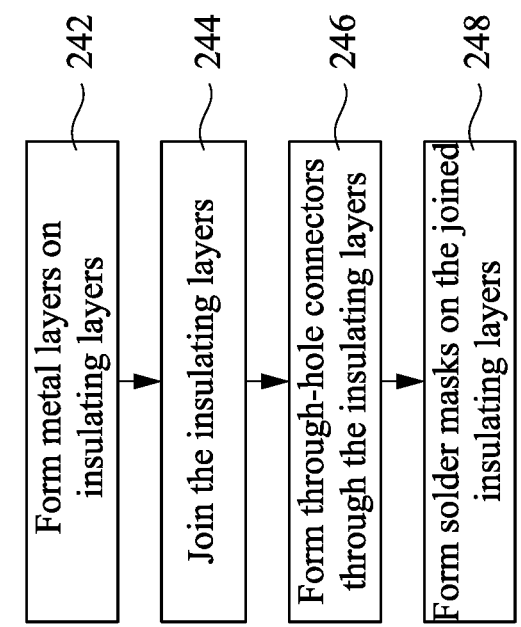
FIG. 9 is a flow chart for forming a PCB in accordance with some embodiments.

FIG. 9 is a flow chart for forming a PCB in accordance with some embodiments. In operation 242, metal layers are formed on insulating layers. The metal layers (e.g., with patterned metal lines) can be formed on the insulating layers as described above with respect to FIG. 4. In operation 244, the insulating layers with the metal layers can be joined together, such as described above with respect to FIG. 4. In operation 246, through-hole connectors are formed through the joined insulating layers, such as described above with respect to FIG. 4. The forming of the through-hole connectors may further form metal layers on exterior surfaces of the joined insulating layers. In operation 248, solder masks are formed on the exterior surfaces and are patterned to expose pads.

Some embodiments can achieve advantages. For example, as described above, a risk of bridging and short circuiting of solder balls can be reduced, which can increase yield of packages attached to PCBs. Further, with the pins as disclosed in some embodiments, solder balls can be formed proximate corner portions of a layout of a package to increase the number of inputs and/or outputs from the package with reduced risk of bridging and short circuiting.

An embodiment is a structure. The structure includes a package. The package includes at least one die, and first solder ball metal pads on an exterior surface of the package, and pin metal pads on the exterior surface of the package.

The structure further includes pins, and each of the pins is attached to a respective one of the pin metal pads.

Another embodiment is a structure. The structure includes a package comprising one or more dies, a printed circuit board (PCB), solder balls, and pins. The solder balls are disposed between the package and the printed circuit board. The solder balls are attached to the package and the printed circuit board. The pins are disposed between the package and the printed circuit board. The pins are attached to the package.

A further embodiment is a method. Solder is disposed on first pads on a side of a package. The package includes one or more dies. Pins are attached on second pads on the side of the package.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device structure, the method comprising:
    attaching a plurality of pins to a first substrate, the first substrate comprising a first plurality of pads, the plurality of pins being attached to a first subset of the first plurality of pads, wherein the pins of the plurality of pins are discontinuous and spaced apart from each other; and
    attaching the first substrate to a second substrate, the second substrate comprising a second plurality of pads, the second plurality of pads being electrically coupled to a second subset of the first plurality of pads, wherein the plurality of pins is between the first substrate and the second substrate.

2. The method of claim 1, wherein the plurality of pins is electrically isolated from the second substrate.

3. The method of claim 2, wherein the plurality of pins comprises a metal material.

4. The method of claim 1, wherein attaching the first substrate to the second substrate comprises forming solder joints between the second plurality of pads and the second subset of the first plurality of pads, wherein each of the plurality of pins has a smaller width than a width of the solder joints.

5. The method of claim 1, wherein the plurality of pins is positioned in one or more corner regions of the first substrate.

6. The method of claim 1, wherein the second substrate comprises a mask, wherein the plurality of pins extends into corresponding openings in the mask.

7. The method of claim 1, wherein the second substrate comprises a third plurality of pads, wherein the plurality of pins is aligned with corresponding ones of the third plurality of pads.

8. A method of forming a semiconductor device structure, the method comprising:
    forming first pads on a first substrate;
    forming pins on the first substrate;
    forming second pads on a second substrate; and
    after forming pins on first substrate, attaching the first substrate to the second substrate using solder material to form solder joints between the first pads and corresponding ones of the second pads.

9. The method of claim 8, wherein forming the pins comprises attaching the pins to the first substrate using solder.

10. The method of claim 8, further comprising:
    forming third pads on the second substrate, wherein, after attaching the first substrate to the second substrate, the pins are aligned with corresponding ones of the third pads.

11. The method of claim 8, wherein a height of a first pin of the pins is in a range from 50% to 80% of a lateral diameter of a first solder joint of the solder joints.

12. The method of claim 8, wherein at least one of the pins is positioned at a corner of the first substrate.

13. The method of claim 8, wherein the second substrate comprises a mask, wherein the pins extend into corresponding recesses in the mask.

14. The method of claim 8, wherein a region between the pins and the second substrate remains free of solder.

15. A method of forming a semiconductor device structure, the method comprising:
    forming first pads and pins on a first substrate;
    placing solder material on the first pads;
    forming second pads on a second substrate; and
    attaching the first substrate to the second substrate using the solder material to form solder joints between the first pads and first corresponding ones of the second pads, wherein material of the pins has a higher melting point than the solder material, wherein the pins are aligned with second corresponding ones of the second pads.

16. The method of claim 15, wherein after attaching, the pins are not attached to the second corresponding ones of the second pads.

17. The method of claim 15, further comprising:
    prior to attaching, forming a mask over the second substrate, the mask having openings exposing the second pads.

18. The method of claim 17, wherein the pins extend below an upper surface of the mask.

19. The method of claim 15, wherein a width of the pins is less than a width of the solder joints.

20. The method of claim 4, wherein a material of the plurality of pins has a higher melting point than the solder joints.

* * * * *